United States Patent
Xu et al.

(10) Patent No.: US 8,390,712 B2
(45) Date of Patent: Mar. 5, 2013

(54) IMAGE SENSING PIXELS WITH FEEDBACK LOOPS FOR IMAGING SYSTEMS

(75) Inventors: Chen Xu, San Jose, CA (US); Yaowu Mo, San Ramon, CA (US)

(73) Assignee: Aptina Imaging Corporation, George Town (KY)

( * ) Notice: Subject to any disclaimer, the term of this patent is extended or adjusted under 35 U.S.C. 154(b) by 176 days.

(21) Appl. No.: 12/963,525

(22) Filed: Dec. 8, 2010

(65) Prior Publication Data

US 2012/0147237 A1    Jun. 14, 2012

(51) Int. Cl.
*H04N 3/14* (2006.01)
*H01L 27/00* (2006.01)

(52) U.S. Cl. ............... 348/301; 348/308; 250/208.1

(58) Field of Classification Search ............ 348/301, 348/308
See application file for complete search history.

(56) References Cited

U.S. PATENT DOCUMENTS

| | | | |
|---|---|---|---|
| 6,532,040 B1 | 3/2003 | Koxlowski et al. | |
| 7,075,130 B2 * | 7/2006 | Delbruck et al. | 257/233 |
| 8,203,111 B2 * | 6/2012 | Reshef et al. | 250/214 A |
| 2004/0046101 A1 | 3/2004 | Nakamura et al. | |
| 2005/0036048 A1 | 2/2005 | Fowler | |
| 2006/0020371 A1 | 1/2006 | Ham et al. | |
| 2006/0284051 A1 * | 12/2006 | Ko et al. | 250/208.1 |
| 2007/0023612 A1 * | 2/2007 | Ko et al. | 250/208.1 |
| 2009/0167914 A1 * | 7/2009 | Itano et al. | 348/301 |
| 2009/0201393 A1 | 8/2009 | Tai et al. | |

* cited by examiner

*Primary Examiner* — Tuan Ho
*Assistant Examiner* — Shahbaz Nazrul
(74) *Attorney, Agent, or Firm* — Treyz Law Group; David C. Kellogg

(57) ABSTRACT

An imaging system may include an image sensor array formed from imaging pixels with feedback loops. Each imaging pixel may include an amplifier transistor that is controlled by a voltage on a floating diffusion node and may include a feedback transistor connected between the floating diffusion node and column readout circuitry. The amplifier transistor, together with a current source in the image sensor array, may form a common-source amplifier that inversely amplifies the voltage on the floating diffusion node and provides control signals to the feedback transistor. The common-source amplifier and the feedback transistor may create a feedback loop during image readout operations and during image reset operations that clamps the voltage on the floating diffusion node.

20 Claims, 9 Drawing Sheets

IMAGE SENSING PIXELS WITH FEEDBACK LOOPS FOR IMAGING SYSTEMS

BACKGROUND

This relates to imaging systems and, more particularly, to image sensing pixels with feedback loops.

Modern electronic devices such as cellular telephones, cameras, and computers often use digital image sensors. Imagers (i.e., image sensors) may be formed from a two-dimensional array of image sensing pixels. Each pixel receives incident photons (light) and converts the photons into electrical signals. Image sensors are sometimes designed to provide images to electronic devices using a Joint Photographic Experts Group (JPEG) format.

Typical imaging sensing pixels include a photodiode that receives incident light and converts the light into an electrical charge, a floating diffusion node, a transfer transistor that shifts the electrical charge to the floating diffusion node, and an output amplifier with an input connected to the floating diffusion node. The performance of conventional imaging sensing pixels is, however, limited by the transfer efficiency and speed of the transfer transistor in each pixel (e.g., the efficiency of the transfer transistor in transferring all of the charge from the photodiode to the floating diffusion node and the speed at which the charge is transferred).

It would therefore be desirable to provide image sensing pixels with feedback loops for imaging systems.

DETAILED DESCRIPTION

Figure 1:
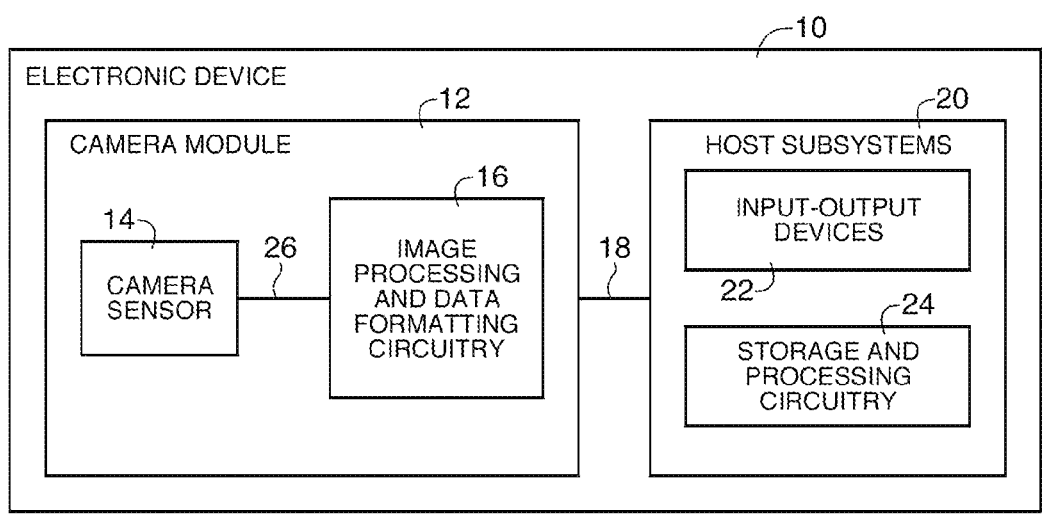
FIG. 1 is a diagram of an illustrative electronic device that may include a camera sensor having imaging pixels with active feedback in accordance with an embodiment of the present invention.

An electronic device with a digital camera module is shown in FIG. 1. Electronic device 10 may be a digital camera, a computer, a cellular telephone, a medical device, or other electronic device. Camera module 12 may include image sensor 14 and one or more lenses. During operation, the lenses focus light onto image sensor 14. Image sensor 14 includes photosensitive elements (i.e., pixels) that convert the light into digital data. Image sensors may have any number of pixels (e.g., hundreds, thousands, millions, or more). A typical image sensor may, for example, have millions of pixels (e.g., megapixels). As examples, image sensor 14 may include address circuitry, analog-to-digital (ADC) converter circuitry amplifier circuitry, switching circuitry (e.g., randomizing switching circuitry), data output circuitry, sample-and-hold circuitry, correlated double sampling (CDS) circuitry, memory (e.g., buffer circuitry), bias circuitry, etc.

Still and video image data from camera sensor 14 may be provided to image processing and data formatting circuitry 16 via path 26. Image processing and data formatting circuitry 16 may be used to perform image processing functions such as data formatting, adjusting white balance and exposure, implementing video image stabilization, face detection, etc. Image processing and data formatting circuitry 16 may also be used to compress raw camera image files if desired (e.g., to Joint Photographic Experts Group or JPEG format). In a typical arrangement, which is sometimes referred to as a system on chip or SOC arrangement, camera sensor 14 and image processing and data formatting circuitry 16 are implemented on a common integrated circuit. The use of a single integrated circuit to implement camera sensor 14 and image processing and data formatting circuitry 16 can help to minimize costs.

Camera module 12 (e.g., image processing and data formatting circuitry 16) conveys acquired image data to host subsystem 20 over path 18. Electronic device 10 typically provides a user with numerous high-level functions. In a computer or advanced cellular telephone, for example, a user may be provided with the ability to run user applications. To implement these functions, host subsystem 20 of electronic device 10 may have input-output devices 22 such as keypads, input-output ports, joysticks, and displays and storage and processing circuitry 24. Storage and processing circuitry 24 may include volatile and nonvolatile memory (e.g., random-access memory, flash memory, hard drives, solid state drives, etc.). Storage and processing circuitry 24 may also include microprocessors, microcontrollers, digital signal processors, application specific integrated circuits, etc.

Figure 2:
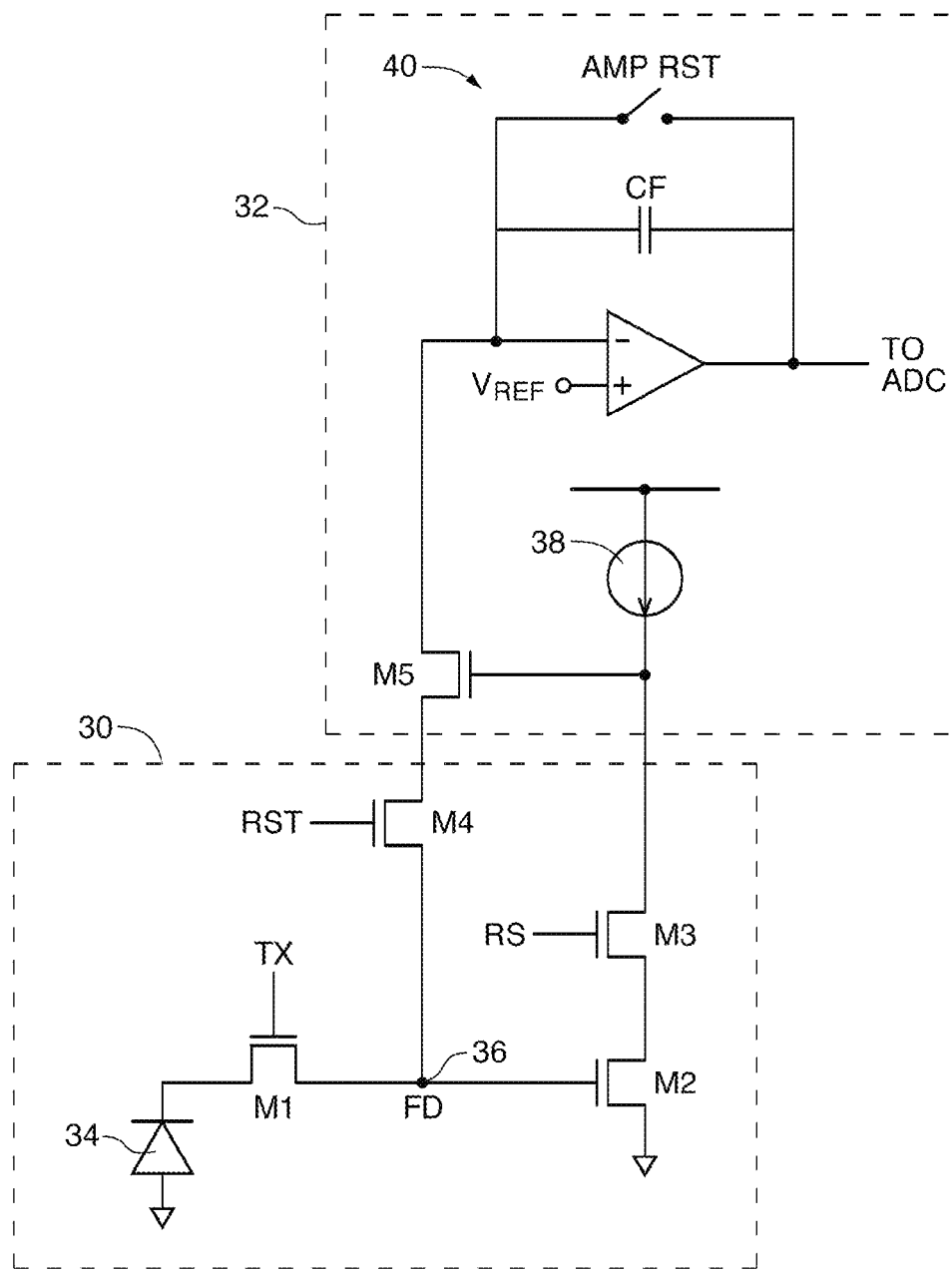
FIG. 2 is a schematic diagram of an illustrative imaging pixel that may include active feedback in accordance with an embodiment of the present invention.

FIG. 2 illustrates an illustrative imaging pixel 30 and image readout circuitry 32 that may include a feedback loop. Camera sensor 14 of FIG. 1 may be formed from imaging pixels such as pixel 30 and image readout circuitry such as circuitry 32. With arrangements of the type shown in FIG. 2, the transfer efficiency of transfer transistors in imaging pixels in sensor 14 may not limit the performance of the imaging pixels (as occurs with conventional imaging pixels). Instead, transfer transistors in the imaging pixels of sensor 14 may function as switches that connect photosensitive elements such as photodiode 34 to output buffers such as amplifier transistor M2 (e.g., via optional floating diffusion nodes such as FD node 36).

As shown in FIG. 2, imaging pixel 30 may include a photodiode such as photodiode 34 that converts incident light into an electrical charge, a floating diffusion node such as FD node 36, a transfer transistor such as transfer transistor M1, an amplifier transistor such as amplifier transistor M2, a row select transistor such as row select transistor M3, and a reset transistor such as reset transistor M4.

Imaging pixel 30 may be a part of an image sensor (such as camera sensor 14 of FIG. 1) that is formed from an array of rows and columns of imaging pixels 30 and that includes image readout circuitry. As an example, camera sensor 14 may include image readout circuits such as circuitry 32 of FIG. 2 connected to each column of imaging pixels 30. With arrangements of this type, each image readout circuit 32 may be associated with and connected to each of the imaging pixels in a particular one of the columns of pixels in camera sensor 14. As shown in the example of FIG. 2, each image readout circuit 32 may include a feedback transistor such as feedback transistor M5, a current source such as current source 38, and column amplifier circuitry such as column amplifier circuitry 40.

With the arrangement of FIG. 2, each imaging pixel 30 of camera sensor 14 may include a negative feedback loop during image readout operations (e.g., when row-select transistor M3 is activated by row select signals on row select path RS and reset transistor M4 is activated by reset signals on reset path RST). Transfer transistor M1 may have a source-drain terminal connected to photodiode 34, a source-drain terminal connected to floating diffusion node 36, and a gate terminal that receives transfer signals TX over a transfer path (e.g., from imaging processing and data formatting circuitry 16 or other circuitry in camera module 12). Amplifier transistor M2 may have a source-drain terminal connected to ground, a source-drain terminal connected to row-select transistor M3, and a gate terminal connected to floating diffusion node 36. Row-select transistor M3 may have a source-drain terminal connected to amplifier transistor M2, a source-drain terminal connected to current source 38 and the gate terminal of feedback transistor M5, and a gate terminal that receives row-select signals RS (e.g., from imaging processing and data formatting circuitry 16 or other circuitry in camera module 12). Reset transistor M4 may have a source-drain terminal connected to floating diffusion 36, a source-drain terminal connected to feedback transistor M5, and a gate terminal that receives reset signals RST over a reset path (e.g., from imaging processing and data formatting circuitry 16 or other circuitry in camera module 12).

The negative feedback loop in imaging pixel 30 may include a common source amplifier formed by transistors M2 and M3 in pixel 30 and current source 38 outside pixel 30 (as part of column readout circuitry 32). The common source amplifier formed with transistors M2 and M3 and current source 38 inversely amplifies the voltage on floating diffusion node 36 (e.g., the output of the common source amplifier at the drain of transistor M3 may be an inverted version of the signal on floating diffusion node 36). The impedance of transistor M5 may be controlled by the output of the common source amplifier (e.g., the voltage at the drain of transistor M3).

With arrangements of the type shown in FIG. 2, transistors M1, M4, and M5 may form a voltage divider between photodiode 34 and column amplifier 40 and the voltage on floating diffusion node 36 may be approximately linearly proportional to the gate voltage on transistor M4 (e.g., the reset signals on reset line RST). The voltage on floating diffusion node 36 may be dependent on the voltage on photodiode 34 (when transfer transistor M1 is activated by transfer signals TX) and may he dependent on the gain of the amplifier formed by transistors M2 and M3 and current source 38. The potential difference between floating diffusion node 36 and photodiode 34 may create a net current that is integrated and converted into a signal voltage by sampling capacitor Cf in column amplifier 40. If desired, the conversion gain of imaging pixel 30 may be defined as the ratio of the capacitance of the sampling capacitor Cf to the capacitance of the photodiode 34.

The negative feedback loop formed in pixel 30 may serve to clamp the voltage on floating diffusion node 36. One effect of this clamping is that during reset operations, the negative feedback loop clamps the floating diffusion node 36 to a fixed voltage, thereby reducing reset noise by a factor approximately equal to the gain of the loop. This effect helps to reduce reset level differences across the different pixels in sensor 14. Another effect of the clamping of the voltage on floating diffusion node 36 is that the feedback loop may act like a buffer to improve the injection efficiency of transfer transistor M1. In particular, since the negative feedback loop clamps the voltage on node 36, there may be no voltage drop wasted across the transfer path of transfer transistor M1.

The column amplifiers 40 in sensor 14 may be reset by closing amplifier reset switch AMP_RST, thereby discharging the signal voltage on sampling capacitor Cf. Amplifier reset switch AMP_RST may be closed to reset column amplifiers 40 at any suitable times such as before reading out a row of imaging pixels, after reading out reset signals, after reading out image signals, after reading out a row of imaging pixels, etc.

During operation of an imaging pixel of the type shown in FIG. 2 and if the voltage on floating diffusion node 36 increases at a first rate, the output of the common source amplifier formed by transistor M2 may decrease at a second rate that is dependent on the first rate and the gain of the common source amplifier. The lower voltage produced by the common source amplifier may be applied to the gate of feedback transistor M5, thereby shifting transistor MS towards an off state. When transistor MS is shifted towards an off state, the source voltage of transistor M5 is lowered, thereby ensuring that the voltage on the floating diffusion node 36 is fixed.

Camera sensor 14 of FIG. 1 may be formed from imaging pixels such as pixel 30 and image readout circuitry such as circuitry 32. With arrangements of the type shown in FIG. 2, the transfer efficiency of transfer transistors in imaging pixels in sensor 14 may not limit the performance of the imaging pixels (as occurs with conventional imaging pixels). Instead, transfer transistors such as transistor M1 in the imaging pixels of sensor 14 may function as switches that connect photosensitive elements to the negative feedback loops in the imaging pixels.

Because the voltage on floating diffusion node 36 is clamped at a fixed level by the feedback loop in pixel 30 during charge transfer (e.g., during imaging readout operations when transistors M1 and M4 are activated), the potential difference between photodiode 34 and floating diffusion 36 is also fixed. The photo-charge in photodiode 34 therefore may not see a barrier between photodiode 34 and floating diffusion 36, thereby making transfer transistor M1 appear as a switch with minimal to no lag transferring charge from photodiode 34 to node 36. Because of the minimal or negligible lag for charge transfer between photodiode 34 and node 36, it may be possible to deepen photodiode 34 (e.g., to provide a deep photodiode) without being limited by lag or transfer efficiency. Deep photodiodes may be capable of converting a larger proportion of incident light into electrical charge than shallow photodiodes.

Figure 3:
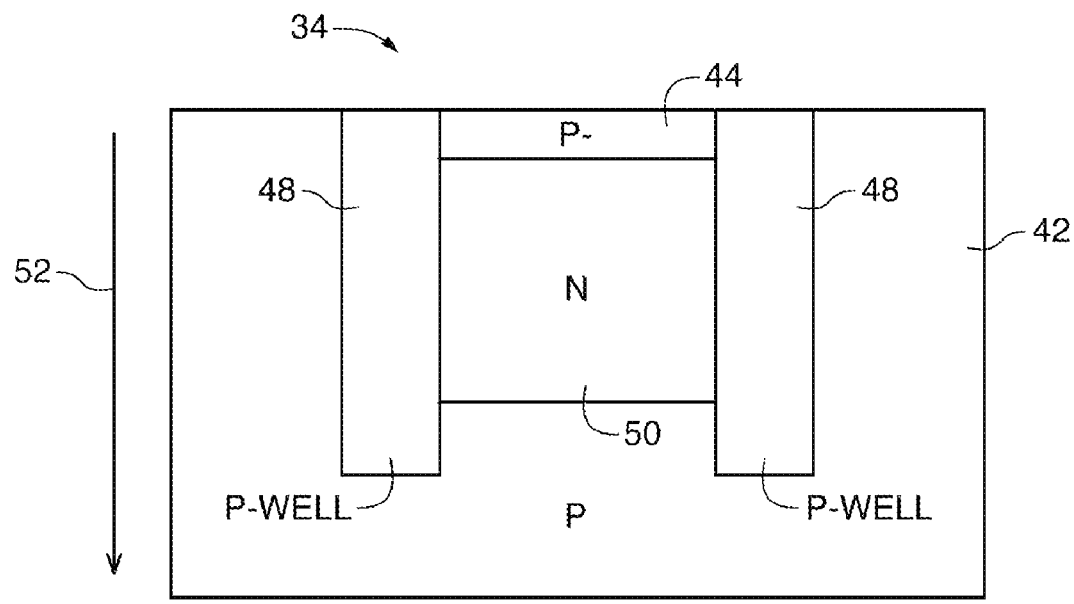
FIG. 3 is a cross section of an illustrative photodiode in an imaging pixel of the type shown in FIG. 2 in accordance with an embodiment of the present invention.

A cross-sectional diagram of a deep photodiode such as photodiode 34 of FIG. 2 is shown in FIG. 3. As shown in FIG. 3, photodiode 34 may be formed in substrate 42. As one example, substrate 42 may be doped with a p-type dopant. As illustrated by arrow 52, photodiode 34 may be formed from doped regions 44, 48, and 50 (e.g., p-wells 48, n-doped region 50, and optional surface pinned doped region 44) that extend depth-wise into substrate 42.

Figure 4:
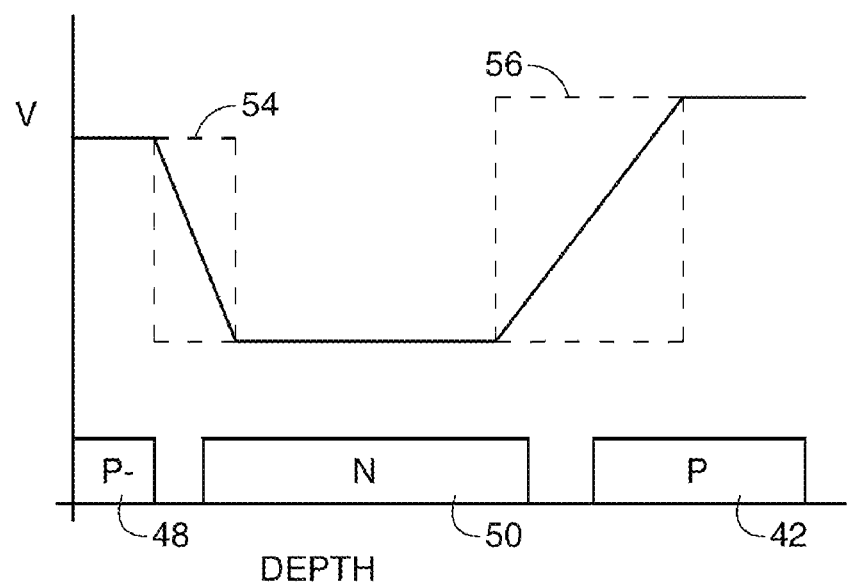
FIG. 4 is a graph of the vertical potential profile of an illustrative photodiode in an imaging pixel of the type shown in FIG. 2 in accordance with an embodiment of the present invention.

FIG. 4 shows a vertical potential profile of a deep photodiode such as photodiode 34 of the type shown in FIG. 3. As shown in FIG. 4, photodiode 34 may not be fully pinned, since the potential profile flattens out between depletions regions 54 and 56 (in contrast with conventional shallow photodiodes that are fully depleted). N-doped region 50 and surrounding regions of substrate 42, p-doped regions 48, and optional lightly p-doped region 44 may form a PN junction that forms a capacitor with a capacitance determined at least partly by the width of depletion regions 54 and 56. The reverse leakage current of the PN junction (e.g., the photocurrent) of photodiode 34 may be proportional to the incident light intensity.

Deep photodiodes such as photodiode 34 shown in FIGS. 2, 3, and 4, may have increased quantum efficiencies (e.g., efficiency at converting incident light into electrical signal), especially for green and red pixels. Deep photodiodes such as photodiode 34 may also allow for backside illumination arrangements with minimal optical crosstalk concerns, which may allow for even smaller pixel arrangements.

One potential drawback with deep photodiode arrangements is the potential for large dark current. To mitigate potential dark current issues, optional surface pined doping may be provided (e.g., by providing an optional lightly doped surface region 44 as shown in FIG. 3).

Another potential drawback with deep photodiode arrangements is the possible introduction of fixed pattern column noise. In particular, it may be desirable to provide imaging pixels 30 with relatively high conversion gains by providing sampling capacitors Cf with relatively small capacitances. However, in arrangements with sampling capacitors Cf that have relatively small capacitances, any differences in the capacitances of the sampling capacitors Cf associated with different columns of pixels in sensor 14 may result in fixed pattern column noise (e.g. the relatively small capacitances may increase the potential for fixed pattern column noise introduced by differences in the capacitances of the sampling capacitors Cf). It may therefore he desirable to balance the goals of minimizing differences in the capacitances of the sampling capacitors (e.g., by increasing the capacitances of the sampling capacitors, thereby facilitating capacitance matching) and maximizing the conversion gain of the pixels (e.g., by decreasing the capacitances of the sampling capacitors).

Figure 5:
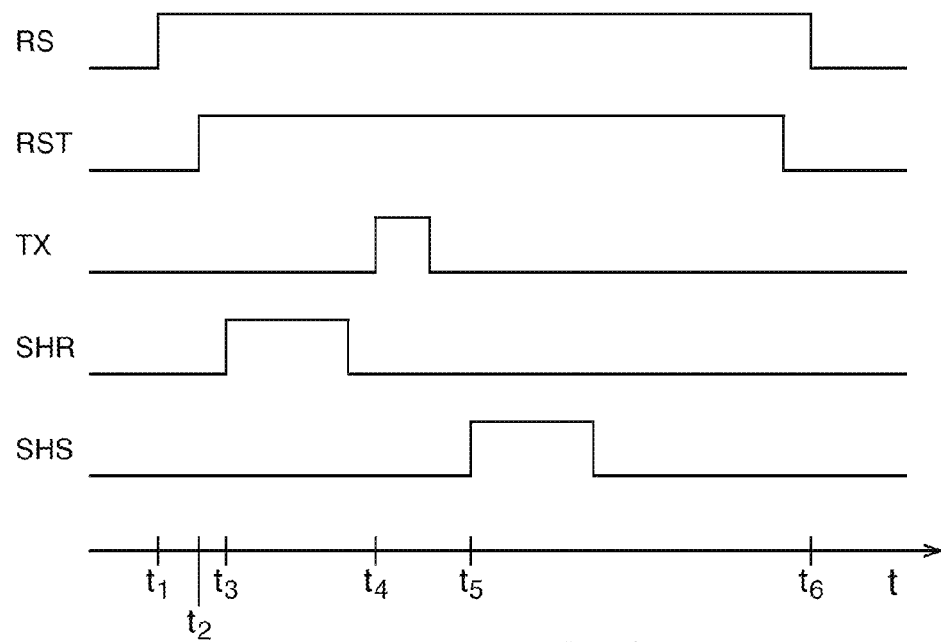
FIG. 5 is a graph of illustrative signals that may be used in reading image data out of an imaging pixel of the type shown in FIG. 2 in accordance with an embodiment of the present invention.

A graph of the values of various potential signals that may be used during image readout operations is shown in FIG. 5.

At time $t_1$, row-select signals RS may be asserted (e.g., taken to a logic high state, which may be at a positive power supply voltage). Row-select signals RS may be asserted on one row (or multiple rows) of image sensing pixels 30 in sensor 14 and may activate the row-select transistors M3 of the pixels in that row.

At time $t_2$, reset signals RST may be asserted. Reset signals RST may be asserted on the same row addressed by row-select signals RS (at time $t_1$) and may activate the reset transistors M4 of the pixels in that row. With reset transistors M4 and row-select transistor M3 activated, negative feedback loops may he formed in pixels 30 of the selected row.

At time $t_3$, sample and hold reset signals (SHR) may be asserted. When sample and hold reset signals are asserted, sample and hold circuitry, which may include column readout circuitry 32 for each column of sensor 14, may sample and hold reset signals from each of the pixels in the currently-selected row (e.g., from the pixels in the row addressed by reset signals RST and row-select signals RS). If desired, the sample and hold circuitry may sample the reset signals when the sample and hold reset signals are deasserted (e.g., upon the falling edge of the SHR signals).

At time $t_4$, transfer signals TX may he asserted. Transfer signals TX may be asserted on the same row addressed by reset signals RST and row-select signals RS (at time $t_1$) and may activate the transfer transistors M1 of the pixels in that row. With reset transistors M4, row-select transistor M3, and transfer transistors M1 activated, the negative feedback loop in pixels 30 of that row is formed and photodiodes 34 in that row are connected to the respective floating diffusion nodes 36. With arrangements of this type, the potential difference between photodiode 34 and floating diffusion node 36 in each imaging pixel 30 may create a current that is integrated and converted to a signal voltage by sampling capacitor Cf in column amplifier circuitry 40.

At time $t_5$, sample and hold image signals (SHS) may be asserted. When sample and hold image signals are asserted, the sample and hold circuitry may sample and hold image signals from each of the pixels in the currently-selected row (e.g., the voltages on floating diffusion nodes 36 which have been shifted from reset values by the accumulated image charges from photodiodes 34). If desired, the sample and hold circuitry may sample the image signals when the sample and hold image signals are deasserted (e.g., upon the falling edge of the SHS signals). In some embodiments, the sample and hold circuitry may use the reset signals in reducing noise from the image signals (e.g., by subtracting the reset signals from the image signals).

At time $t_6$, reset signals RST and row-select signals RS may be deasserted, thereby disconnecting the selected row from column readout circuitry such as circuitry 32 of FIG. 2.

Following time $t_6$, the signals of FIG. 5 may be applied to subsequent rows of pixels 30 in sensor 14 (e.g., to read out all of the rows of pixels 30 using an electronic rolling shutter technique).

Variations on the arrangement of imaging pixel 30 and column readout circuitry 32 of FIG. 2 are shown in FIGS. 6, 7, 8, 9, and 10. If desired, the modifications shown in FIGS. 6, 7, 8, 9, and 10 may he applied in combination or independently. As an example, each of the modifications illustrated in FIGS. 7, 8, 9, and 10 may be applied to pixel sharing arrangements such as the arrangement of FIG. 6.

Figure 6:
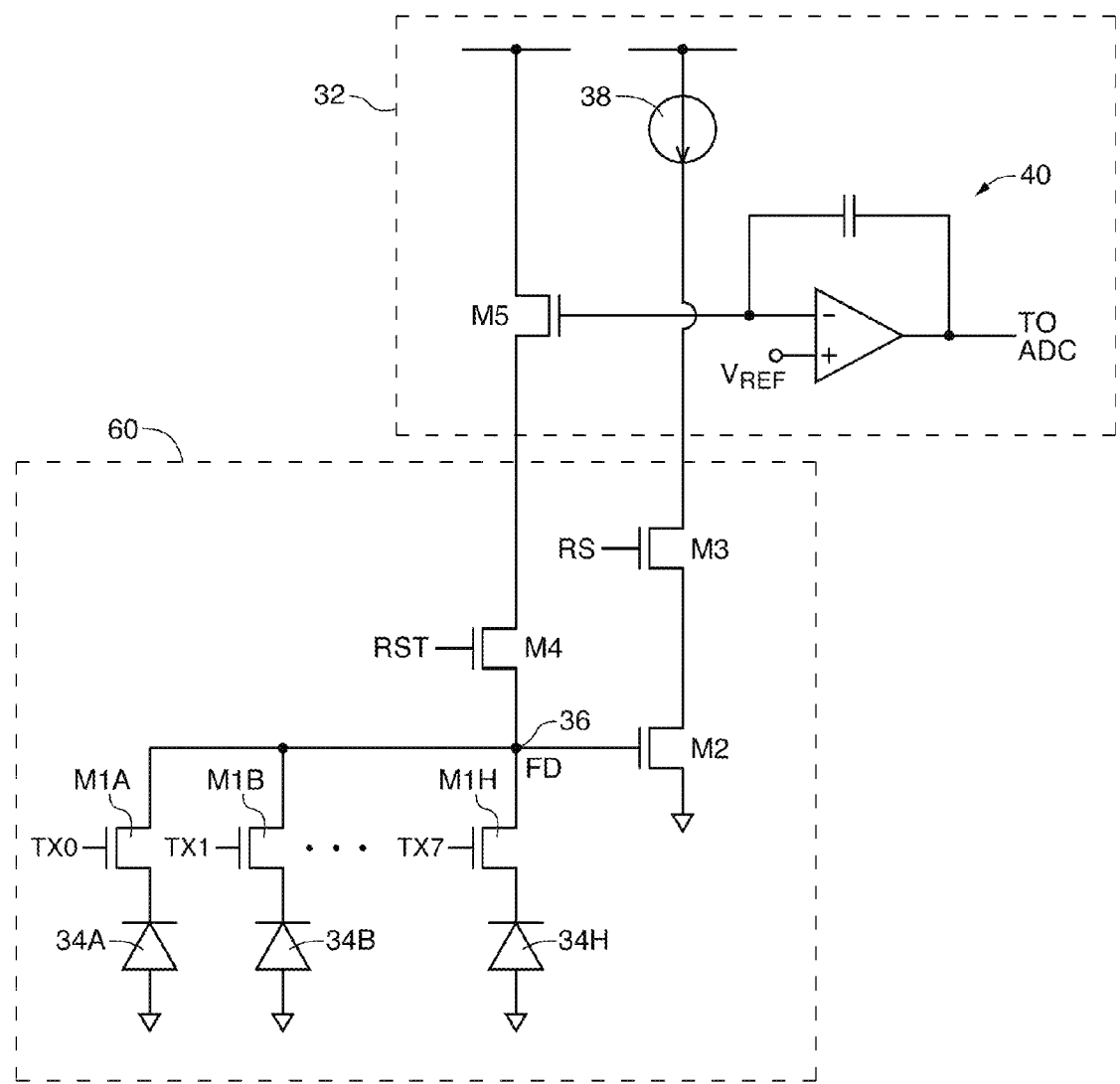
FIG. 6 is a schematic diagram of an illustrative image sensor that may include imaging pixels that share common circuits in accordance with an embodiment of the present invention.

As shown in FIG. 6, pixel sharing arrangements may be implemented with two or more photodiodes 34 sharing a common floating diffusion node as part of imaging circuitry 60. In the example of FIG. 6, an eight-way pixel sharing arrangement is illustrated. If desired, fewer or additional photodiodes may share common circuits such as a floating diffusion node. As one example, each photodiode (e.g., photodiodes 34A, 34B . . . and 34F) in imaging pixel circuitry 60 may be connected to a common floating diffusion node such as node 36 through a transfer transistor unique to that photodiode. For example, photodiode 34A may be connected to node 36 through transfer transistor M1A, which may be controlled by transfer signals TX0, photodiode 34B may be connected to node 36 through transfer transistor M1B, which may be controlled by transfer signals TX1, . . . , and photodiode 34H may be connected to node 36 through transfer transistor M1H, which may be controlled by transfer signals TX7.

With pixel sharing arrangements such as the arrangement of FIG. 6, pixels 34 may be read out individually (by asserting only a single set of transfer signals such as transfer signals TX0, while desasserting additional transfer signals such as signals TX1, TX2, . . . , and TX7). Alternatively, signals from pixels 34 may be summed together in order to increase signal-to-noise ratios (SNR). When signals from pixels 34 are summed together onto floating diffusion node 36 (e.g., by simultaneously asserting transfer signals TX1, TX2, . . . , and TX7), camera sensor 14 may capture images in a sub-sampling mode (e.g., images produced when signals from pixels 34 are summed together may have a lower overall resolution compared to when signals are not summed together).

If desired, row-select transistor control voltages RS may be biased to a voltage between logic high (e.g., a positive power supply voltage) and logic low (e.g., a ground power supply voltage). With this type of arrangement, row-select transistor RS may form a cascade buffer with increased gain.

Figure 7:
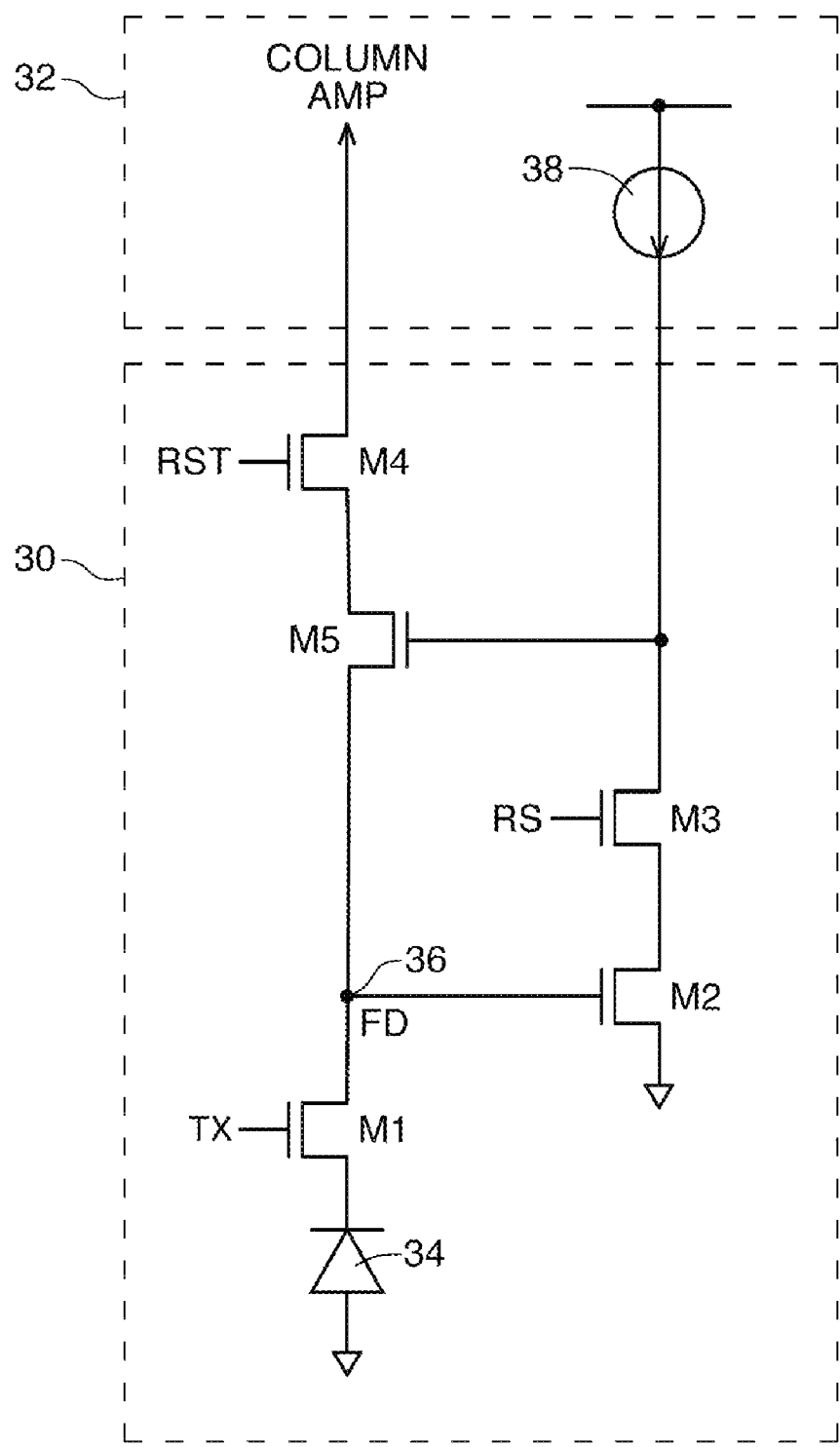
FIG. 7 is a schematic diagram of an illustrative imaging pixel such as the imaging pixel of FIG. 2 where a reset transistor has been moved out of an active feedback loop in accordance with an embodiment of the present invention.

A second variation on the arrangement of FIG. 2 is shown in FIG. 7. In the example of FIG. 7, feedback transistor M5 may be moved from column readout circuitry 32 to imaging pixel 30 (e.g., transistor M5 may be located between transistor M4 and floating diffusion node 36.

Figure 8:
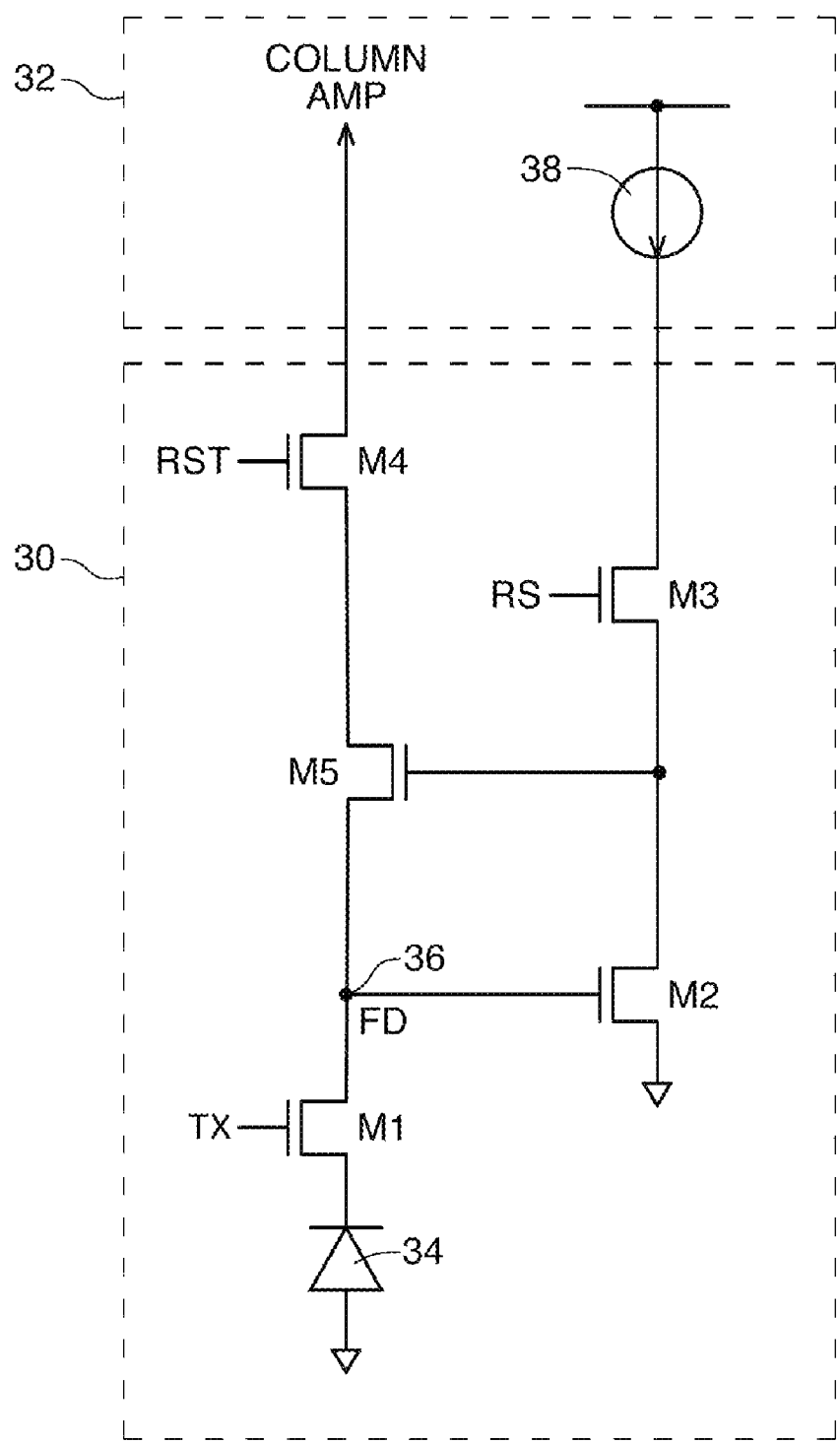
FIG. 8 is a schematic diagram of an illustrative imaging pixel such as the imaging pixel of FIG. 2 where a reset transistor and a row select transistor have been moved out of an active feedback loop in accordance with an embodiment of the present invention.

A third variation on the arrangement of FIG. 2 is shown in FIG. 8. In the example of FIG. 8, feedback transistor M5 may be located between transistor M4 and floating diffusion node 36 and the gate terminal of feedback transistor M5 may be connected to a source-drain terminal of amplifier transistor M2 (rather than being connected to amplifier transistor M2 through row-select transistor M3).

Figure 9:
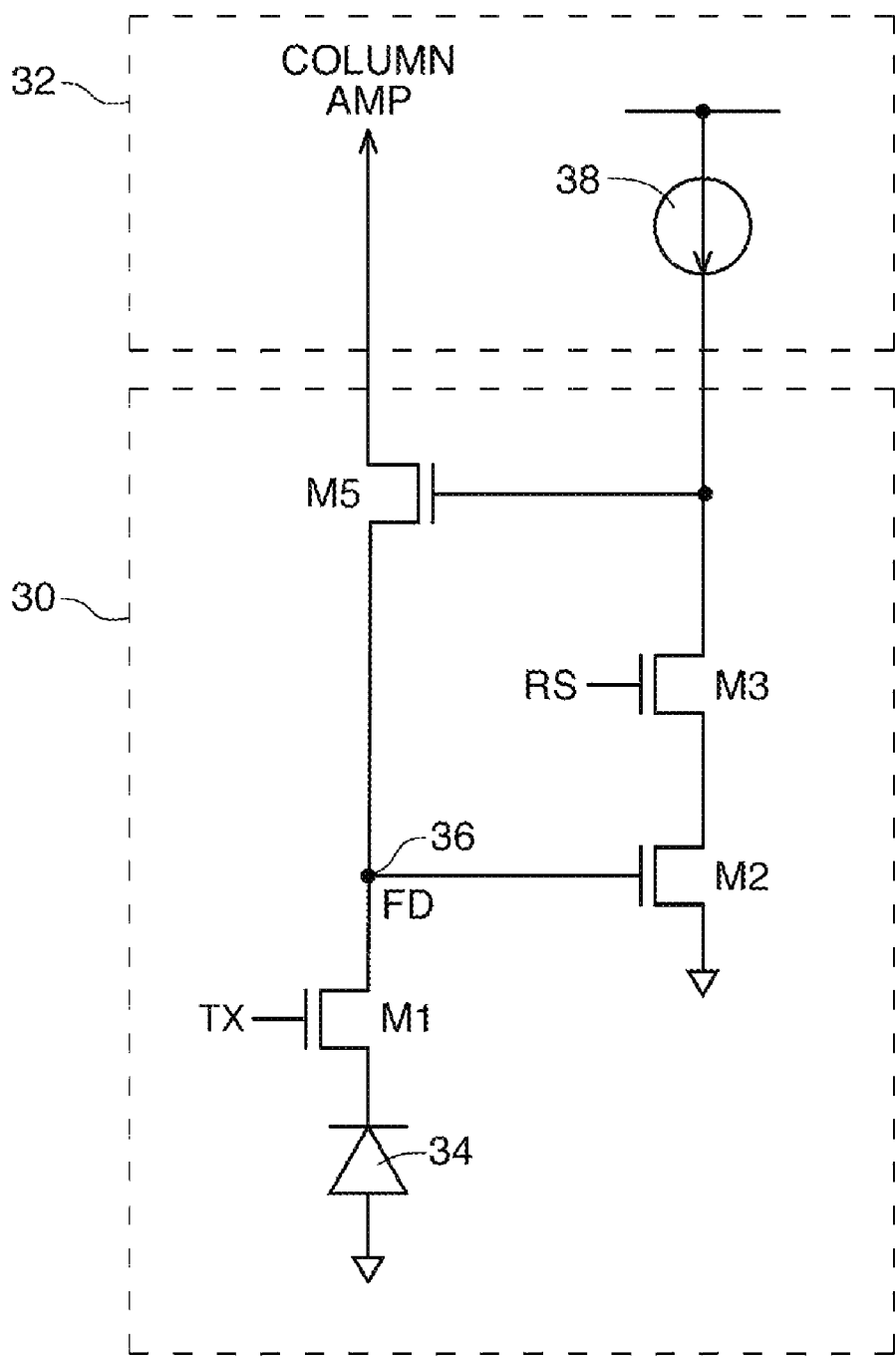
FIG. 9 is a schematic diagram of an illustrative imaging pixel such as the imaging pixel of FIG. 2 where the imaging pixel does not include a reset transistor in accordance with an embodiment of the present invention.

A fourth variation on the arrangement of FIG. 2 is shown in FIG. 9. In the example of FIG. 9, reset transistor M4 may be omitted and feedback transistor M5 may be a part of imaging pixel 30 (rather than being a part of column readout circuitry 32).

Figure 10:
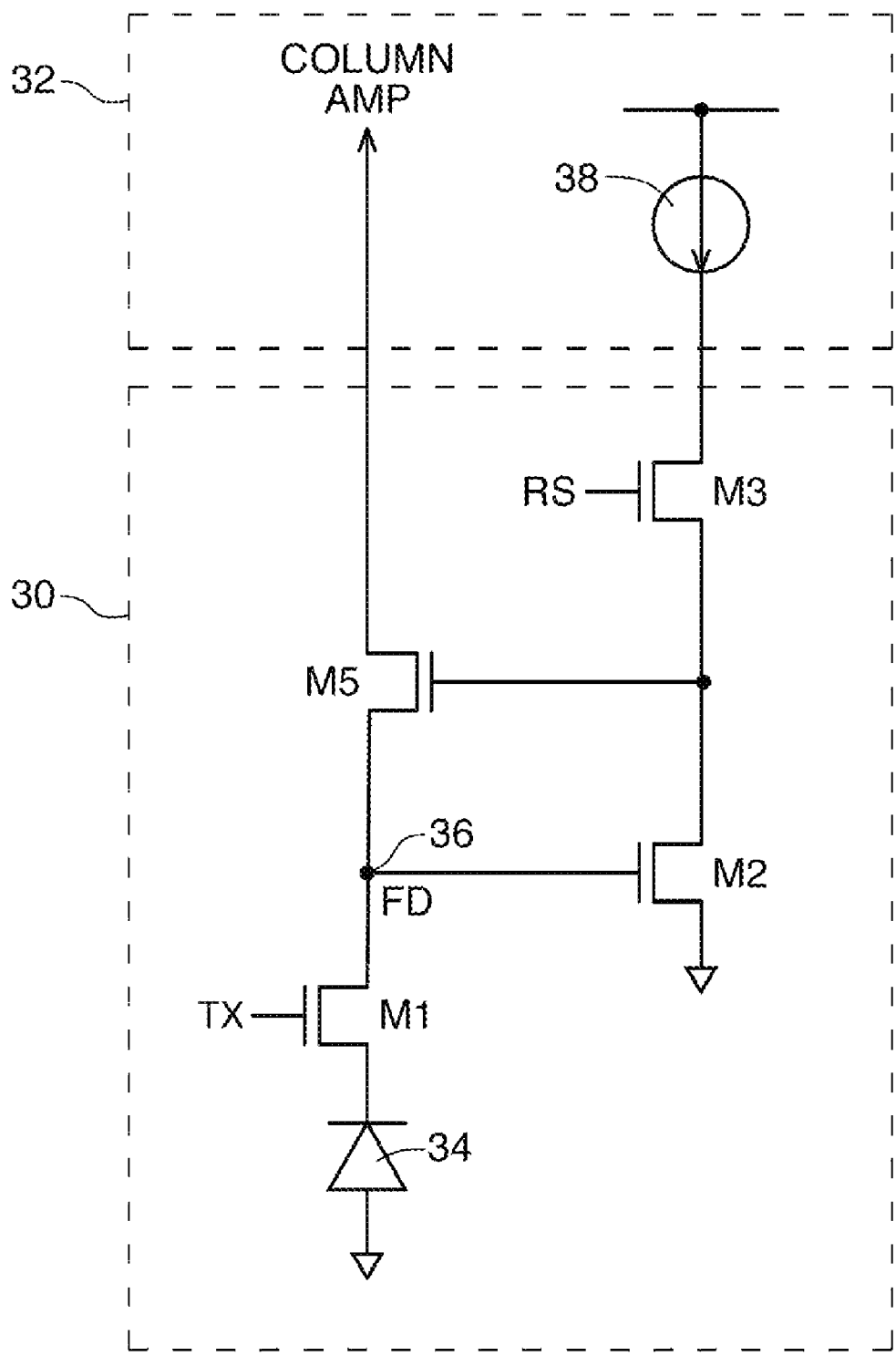
FIG. 10 is a schematic diagram of an illustrative imaging pixel such as the imaging pixel of FIG. 2 where the imaging pixel does not include a reset transistor and where a row select transistor has been moved out of an active feedback loop in accordance with an embodiment of the present invention.

A fifth variation on the arrangement of FIG. 2 is shown in FIG. 10. In the example of FIG. 10, reset transistor M4 may be omitted, feedback transistor M5 may be a part of imaging pixel 30 (rather than being a part of column readout circuitry 32), and the gate terminal of feedback transistor M5 may be connected to a source-drain terminal of amplifier transistor M2 (rather than being connected to amplifier transistor M2 through row-select transistor M3).

Arrangements of the type shown in FIG. 2 may be desirable for relatively low resolution image sensors (e.g., VGA resolution image sensors, 1.3 megapixel image sensors, etc.), due to column loading effects (e.g., because each feedback transistor M5 is connected to all of the imaging pixels 30 in a column of sensor 14).

Arrangements of the type shown in FIGS. 7 and 8 may be desirable when the size of imaging pixels 30 is less of a concern. The arrangements of FIGS. 7 and 8 may provide additional performance in terms of feedback efficiency, at the cost of increasing the size of imaging pixels (relative to the FIG. 2 arrangement in which transistor M5 is not formed in each imaging pixel).

Arrangements of the type shown in FIGS. 9 and 10 may be desirable when the size of imaging pixels 30 is more of a concern. The arrangements of FIGS. 9 and 10 may be preferable for small pixels such as sub-micron pixels (e.g., pixels with a length of less than approximately 1 micron and a width of less than approximately 1 micron), as the arrangements of FIGS. 9 and 10 eliminate reset transistor M4 and the associated circuitry in camera module 12 for driving reset signals RST.

Various embodiments have been described illustrating image sensing pixels with feedback loops for imaging systems.

An electronic device may have a camera module with an image sensor array that captures images. The image sensor may be formed from imaging pixels having feedback loops. Each imaging pixel may include an amplifier transistor that is controlled by a voltage on a floating diffusion node and may include a feedback transistor connected between the floating diffusion node and column readout circuitry. The amplifier transistor, together with a current source in the image sensor array, may form a common-source amplifier that inversely amplifies the voltage on the floating diffusion node and provides control signals to the feedback transistor. The common-source amplifier and the feedback transistor may create a feedback loop during image readout operations and during image reset operations that clamps the voltage on the floating diffusion node. Because the voltage on the floating diffusion node may be clamped using the feedback loop, reset noise may be reduced, charge transfer times may be reduced, and it may be possible to provide relatively deep photodiodes, without sacrificing performance characteristics.

Various modifications and forms of the imaging pixels may be provided. In one variation, multiple photodiodes are connected to common circuitry such as a floating diffusion node, a feedback transistor, a reset transistor, an amplifier transistor, and a row-select transistor. Transfer transistors unique to each of the photodiodes may connect each photodiode to the common circuitry. This type of arrangement may facilitate charge summing operations in which signal to noise ratios are increased, at the sacrifice of full resolution. In other variations, feedback transistors may be included in individual imaging pixels or in column readout circuitry, reset transistors may be omitted, feedback transistors may have gate terminals connected directly to an amplifier transistor or may be connected to the amplifier transistor through a row-select transistor. These are merely examples.

The foregoing is merely illustrative of the principles of this invention which can be practiced in other embodiments.

What is claimed is:

1. An image sensing pixel in an image sensor comprising:
   a photosensitive element that generates electrical signals in response to incident light;
   an amplifier transistor having a gate terminal that receives the electrical signals and that outputs an amplified version of the electrical signals; and
   a feedback transistor coupled between the photosensitive element and image readout circuitry in the image sensor, wherein the feedback transistor has a gate terminal that is coupled to the amplifier transistor and that receives the amplified version of the electrical signals.

2. The image sensing pixel defined in claim 1 further comprising a row select transistor having a gate terminal that is connected to a row select path that carries row select signals.

3. The image sensing pixel defined in claim 1 further comprising a row select transistor having first and second source-drain terminals and a gate terminal that is connected to a row select path that carries row select signals, wherein the gate terminal of the feedback transistor is connected to the first source-drain terminal of the row select transistor and the second source-drain terminal of the row select transistor is connected to the amplifier transistor such that the gate terminal of the feedback transistor is coupled to the amplifier transistor through the row select transistor.

4. The image sensing pixel defined in claim 1 wherein the gate terminal of the feedback transistor is directly electrically connected to a source-drain terminal of the amplifier transistor.

5. The image sensing pixel defined in claim 4 further comprising a row select transistor having a first source-drain terminal connected to the source-drain terminal of the amplifier transistor and having a second source-drain terminal connected to a current source in the image readout circuitry in the image sensor.

6. The image sensing pixel defined in claim 5 wherein the amplifier transistor is connected between the row select transistor and a terminal at a ground voltage.

7. The image sensing pixel defined in claim 1 further comprising a transfer transistor coupled between the photosensitive element and the amplifier and feedback transistors.

8. The image sensing pixel defined in claim 1 further comprising:
   a transfer transistor that is coupled between the photosensitive element and the amplifier and feedback transistors and that has a gate terminal that is connected to a transfer path that carries transfer signals;
   a row select transistor having a gate terminal that is connected to a row select path that carries row select signals; and
   a reset transistor having a gate terminal that is connected to a reset path that carries reset signals.

9. An image sensor comprising:
   an array of image sensing circuits arranged in rows and columns; and
   a plurality of column readout circuits, each of which is coupled to and associated with a respective one of the columns of image sensing circuits, wherein each of the image sensing circuits comprises:
     a plurality of photosensitive elements, each of which generates an electrical signal in response to incident light;
     a floating diffusion node;
     a plurality of transfer transistors each of which is connected between a respective one of the photosensitive elements in that image sensor circuit and the floating diffusion node in that image sensor circuit; and
     an amplifier transistor having a gate terminal that is connected to the floating diffusion node in that image sensor circuit and outputs an amplified version of at least one of the electrical signals, wherein each of the column readout circuits comprises:
       a feedback transistor that has a gate terminal that is coupled to the amplifier transistors of a respective plurality of the image sensing circuits and that receives the amplified versions of the at least one of the electrical signals from those image sensing circuits.

10. The image sensor defined in claim 9 wherein each of the column readout circuits comprises a current source.

11. The image sensor defined in claim 9 wherein each of the image sensing circuits further comprises a row select transistor.

12. The image sensor defined in claim 11 wherein the amplifier transistor in each of the image sensing circuits is connected between the row select transistor in that image sensing circuit and a terminal at a ground voltage.

13. The image sensor defined in claim 9 wherein each of the image sensing circuits further comprises a reset transistor and wherein the floating diffusion node of each of the image sensing circuits is coupled between the transfer transistors of that image sensing circuit and the reset transistor of that image sensing circuit.

14. The image sensor defined in claim 9 wherein each of the column readout circuits comprises a current source and wherein each of the image sensing circuits further comprises:
   a row select transistor; and
   a reset transistor, wherein the floating diffusion node of each of the image sensing circuits is coupled between the transfer transistors of that image sensing circuit and the reset transistor of that image sensing circuit.

15. An image sensor comprising:
   an array of image sensing pixels arranged in rows and columns; and
   a plurality of column readout circuits, each having a column amplifier and each of which is coupled to and associated with the image sensing pixels in a respective one of the columns of image sensing pixels, wherein each of the image sensing pixels comprises:
     a photosensitive element that generates electrical signals in response to incident light; and
     an amplifier transistor having a gate terminal that receives the electrical signals from the photosensitive element in that image sensing pixel and that outputs an amplified version of the electrical signals, wherein each of the column readout circuits comprises:
       a feedback transistor coupled between the column amplifier in that column readout circuit and the photosensitive elements in the image sensing pixels that are associated with that column readout circuit, wherein each of the feedback transistors has a gate terminal that is coupled to the amplifier transistors in the image sensing pixels that are associated with that column readout circuit.

16. The image sensor defined in claim 15 wherein each of the column readout circuits further comprises a current source connected to the gate terminal of the feedback transistor in that column readout circuit.

17. The image sensor defined in claim 16 wherein each of the image sensing pixels further comprise a floating diffusion node.

18. The image sensor defined in claim 17 wherein each of the image sensing pixels further comprises a transfer transistor connected between the photosensitive element and the floating diffusion node in that image sensing pixel.

19. The image sensor defined in claim 18 wherein each of the image sensing pixels further comprises a row select transistor connected between the amplifier transistor in that image sensing pixel and the current source of the column readout circuit coupled to and associated with that image sensing pixel.

20. The image sensor defined in claim 19 further comprising a reset transistor connected between the floating diffusion node in that image sensing pixel and the feedback transistor of the column readout circuit coupled to and associated with that image sensing pixel.

* * * * *